United States Patent
Shin et al.

(10) Patent No.: US 12,506,074 B2
(45) Date of Patent: *Dec. 23, 2025

(54) INTERCONNECT STRUCTURE TO REDUCE CONTACT RESISTANCE, ELECTRONIC DEVICE INCLUDING THE SAME, AND METHOD OF MANUFACTURING THE INTERCONNECT STRUCTURE

(71) Applicant: Samsung Electronics Co., Ltd., Suwon-si (KR)

(72) Inventors: Hyeonjin Shin, Suwon-si (KR); Sangwon Kim, Seoul (KR); Kyung-Eun Byun, Suwon-si (KR); Hyunjae Song, Hwaseong-si (KR); Keunwook Shin, Yongin-si (KR); Eunkyu Lee, Yongin-si (KR); Changseok Lee, Gwacheon-si (KR); Yeonchoo Cho, Seongnam-si (KR); Taejin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 442 days.

This patent is subject to a terminal disclaimer.

(21) Appl. No.: 18/297,852

(22) Filed: Apr. 10, 2023

(65) Prior Publication Data
US 2023/0253320 A1    Aug. 10, 2023

Related U.S. Application Data
(63) Continuation-in-part of application No. 17/398,363, filed on Aug. 10, 2021, now Pat. No. 11,626,502.

(30) Foreign Application Priority Data
Nov. 27, 2020    (KR) .................. 10-2020-0163337

(51) Int. Cl.
*H01L 23/528*   (2006.01)
*H10B 53/30*    (2023.01)

(52) U.S. Cl.
CPC ......... *H01L 23/5283* (2013.01); *H10B 53/30* (2023.02)

(58) Field of Classification Search
None
See application file for complete search history.

(56) References Cited

U.S. PATENT DOCUMENTS

| 9,478,626 B2 | 10/2016 | Chi et al. |
| 9,761,532 B2 | 9/2017 | Shin et al. |

(Continued)

FOREIGN PATENT DOCUMENTS

| CN | 103715176 A | 4/2014 |
| CN | 109119509 A | 1/2019 |

(Continued)

OTHER PUBLICATIONS

Notice of Allowance dated Dec. 2, 2022, issued in corresponding U.S. Appl. No. 17/398,363.

*Primary Examiner* — Michael Lebentritt
(74) *Attorney, Agent, or Firm* — HARNESS, DICKEY & PIERCE, P.L.C.

(57) ABSTRACT

An interconnect structure for reducing a contact resistance, an electronic device including the same, and a method of manufacturing the interconnect structure are provided. The interconnect structure includes a semiconductor layer including a first region having a doping concentration greater than a doping concentration of the rest region of the semiconductor layer, a metal layer facing the semiconductor layer, a semi-metal layer between the semiconductor layer (Continued)

and the metal layer, and a conductive metal oxide layer between the semi-metal layer and the semiconductor and covering the first region.

20 Claims, 11 Drawing Sheets

(56) References Cited

U.S. PATENT DOCUMENTS

| | | |
|---|---|---|
| 11,088,077 B2 | 8/2021 | Song et al. |
| 11,626,502 B2 * | 4/2023 | Shin .................. H01L 21/28512 |
| | | 257/741 |
| 2016/0035676 A1 | 2/2016 | Im et al. |
| 2018/0197918 A1 | 7/2018 | Bertin et al. |
| 2020/0243676 A1 | 7/2020 | Tomida |
| 2021/0159183 A1 | 5/2021 | Byun et al. |
| 2022/0020753 A1 | 1/2022 | Jung et al. |
| 2022/0254870 A1 | 8/2022 | Lee et al. |

FOREIGN PATENT DOCUMENTS

| | | |
|---|---|---|
| KR | 101262319 B1 | 5/2013 |
| KR | 2016/0100711 A | 8/2016 |
| KR | 2017/0037444 A | 4/2017 |
| KR | 2020/0011197 A | 2/2020 |
| KR | 2020/0035002 A | 4/2020 |

* cited by examiner

INTERCONNECT STRUCTURE TO REDUCE CONTACT RESISTANCE, ELECTRONIC DEVICE INCLUDING THE SAME, AND METHOD OF MANUFACTURING THE INTERCONNECT STRUCTURE

CROSS-REFERENCE TO RELATED APPLICATION

This application is a continuation in part of U.S. patent application Ser. No. 17/398,363, filed Aug. 10, 2021, which claims the benefit of Korean Patent Application No. 10-2020-0163337, filed on Nov. 27, 2020, in the Korean Intellectual Property Office, the disclosure of each of which is incorporated herein in its entirety by reference.

BACKGROUND

1. Field

The present disclosure relates to a stacked structure for improving interlayer characteristics, and more particularly, to an interconnect structure that lowers a contact resistance, an electronic device including the same, and a method of manufacturing the interconnect structure.

2. Description of the Related Art

The development of semiconductor technology has made the miniaturization or downsizing of unit semiconductor devices (e.g., transistors, capacitors, etc.) possible. Accordingly, the increase in the degree of integration of semiconductor devices became possible, and also the manufacture of various semiconductor devices and electronic devices that were not previously available became possible. As the degree of integration of semiconductor devices increases, wires connecting the devices become thinner. Accordingly, a contact resistance between layers and between wirings and devices also increases. Since the increase of the contact resistance may cause an operation delay of a device as well as an increase in power consumption, various methods for reducing the contact resistance have been sought.

SUMMARY

Provided are interconnect structures that reduce contact resistance.

Provided are methods of manufacturing the interconnect structures.

Provided are electronic devices including an interconnect structure that reduces contact resistance.

Additional aspects will be set forth in part in the description which follows and, in part, will be apparent from the description, or may be learned by practice of the presented embodiments of the disclosure.

According to some example embodiments, an interconnect structure includes a semiconductor layer including a first region having a doping concentration higher than a rest region of the semiconductor layer, a metal layer facing the semiconductor layer, a semi-metal layer between the semiconductor layer and the metal layer, and a conductive metal oxide layer between the semi-metal layer and the semiconductor layer and covering the first region. In one example, an insulating layer may be on the semiconductor layer and may include a via hole through which the first region is exposed and the conductive metal oxide layer, the graphene layer, and the metal layer may be sequentially stacked in the via hole. In one example, a metal silicide layer may be further provided between the semiconductor layer and the conductive metal oxide layer. In one example, a metal carbide layer may be further provided between the graphene layer and the conductive metal oxide layer. In one example, the conductive metal oxide layer may include a two-component conductive metal oxide layer, a three-component conductive metal oxide layer, or a four-component conductive metal oxide layer. In one example, the semiconductor layer may include a trench, and the first region may be provided in a bottom layer and a side layer of the trench. In one example, the semiconductor layer may include a protruded portion, and the first region may be provided in an upper layer and a side layer of the protruded portion.

According to an embodiment, an electronic device includes a transistor, a conductive plug, and a data storage element connected to the transistor. The transistor and the data storage element are connected to each other through the conductive plug, and the conductive plug includes the interconnect structure according to an embodiment. In one example, the data storage element may be a ferroelectric capacitor including a lower electrode in contact with the conductive plug, a dielectric layer on the lower electrode, and an upper electrode on the dielectric layer. In one example, a metal silicide layer may be further provided between the conductive metal oxide layer and the semiconductor layer. In one example, a metal carbide layer may be further provided between the semi-metal layer and the conductive metal oxide layer.

According to some example embodiments, an electronic device includes a first semiconductor layer having a first doped region, a multiple quantum well layer on the first semiconductor layer so as not to contact the first doped region, a second semiconductor layer on the multiple quantum well layer and having a second doped region, a first connect layer and a first metal layer sequentially stacked on the first doped region, and a second connect layer and a second metal layer sequentially stacked on the doped region. Each of the first and second connect layers includes a conductive metal oxide layer and a semi-metal layer on the conductive metal oxide layer. In one example, a metal silicide layer may be further provided between the conductive metal oxide layer and the first and second doped regions. A metal carbide layer may be provided between the semi-metal layer and the first and second metal layers.

According to some example embodiments, a method of manufacturing an interconnect structure includes forming a first doped region in a semiconductor layer and having a doping concentration greater than a rest region of the semiconductor layer, and then, sequentially stacking a conductive metal oxide layer, a semi-metal layer, and a metal layer covering the first doped region on the semiconductor layer. Subsequently, the method may include forming a mask on the metal layer to cover a portion of the first doped region, sequentially etching the metal layer, the semi-metal layer, and the conductive metal oxide layer around the mask, and removing the mask. In one example, a metal silicide layer may be further formed between the conductive metal oxide layer and the semiconductor layer, and the metal silicide layer around the mask may also be etched in the etching operation. In one example, a metal carbide layer may be further formed between the conductive metal oxide layer and the semi-metal layer, and the metal carbide layer around the mask may also be etched in the etching operation.

According to some example embodiments, a method of manufacturing an interconnect structure includes forming a first doped region in a semiconductor layer and having a doping concentration greater than a peripheral region in the semiconductor layer, forming a mask exposing a portion of the first doped region on the semiconductor layer to provide an exposed area of the first doped region, sequentially stacking a conductive metal oxide layer, a semi-metal layer, and a metal layer covering the exposed area of the first doped region, and removing the mask. In one example, a metal silicide layer may be further formed between the conductive metal oxide layer and the semiconductor layer. In one example, a metal carbide layer may be further formed between the conductive metal oxide layer and the semi-metal layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
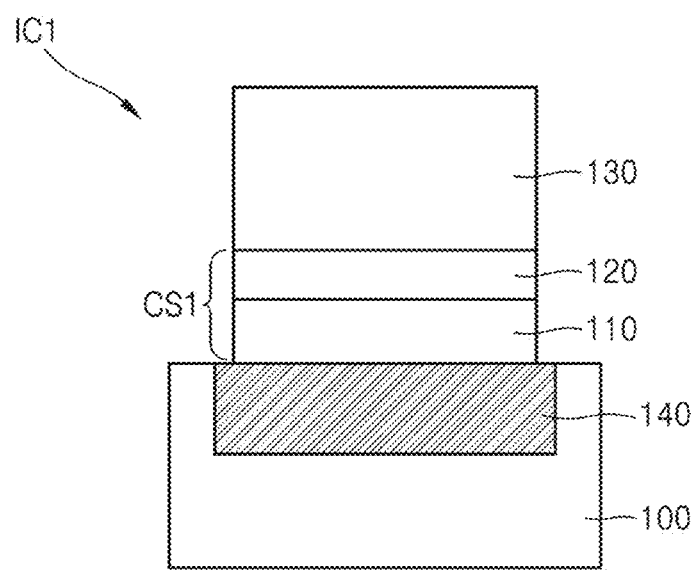
FIG. 1 is a cross-sectional view of a first interconnect structure according to an example embodiment.

Reference will now be made in detail to some example embodiments, some of which are illustrated in the accompanying drawings, wherein like reference numerals refer to like elements throughout. In this regard, the present embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an interconnect structure and a method of manufacturing the interconnect structure according to some example embodiments will be described in detail with reference to the accompanying drawings. In this process, the thicknesses of layers or regions shown in the drawings may be exaggerated somewhat for clarity of the specification. Embodiments of inventive concepts described below are capable of various modifications and may be embodied in many different forms. Also, in a layer structure described below, when an element or layer is referred to as being "on" or "above" another element or layer, the element or layer may be directly on another element or layer or intervening elements or layers. In the following descriptions, like reference numerals in each drawing indicate like elements.

First, an interconnect structure that reduces a contact resistance will be described.

FIG. 1 shows a first interconnect structure IC1 according to an example embodiment.

Referring to FIG. 1, the first interconnect structure IC1 has a stacked structure in which a semiconductor layer 100, a first connect stack CS1, and a metal layer 130 are sequentially stacked. The semiconductor layer 100 may be a P-type or N-type semiconductor layer, or may include a P-type or N-type semiconductor. In one example, the semiconductor layer 100 may be a layer including a Group IV element having semiconductor properties of the periodic table, such as a Si layer and a Ge layer.

In one example, the semiconductor layer 100 may include a compound semiconductor layer, for example, a Group III-V compound semiconductor layer. In one example, the semiconductor layer 100 may be a single layer. In another example, the semiconductor layer 100 may be a multilayer. The semiconductor layer 100 may include a first region 140 doped with a conductive impurity. The first region 140 may have a given depth on an upper surface of the semiconductor layer 100. The first region 140 is separated from a bottom surface of the semiconductor layer 100. For convenience of illustration, the first region 140 is illustrated as a square, but may not be a square. When the first region 140 is not a square, the first region 140 may have a different depth according to a position within the first region 140.

In one example, the semiconductor layer 100 may be an N-type semiconductor layer, and the doping concentration of the first region 140 may be greater than that of other regions of the semiconductor layer 100. Accordingly, a width of an energy band of the first region 140 may be narrowed, and thus, the tunneling resistance may be lowered. The result may be one of factors that bring about the effect of reducing the contact resistance. When the semiconductor layer 100 is an N-type semiconductor layer, a doping concentration of the first region 140 may be in a range about $1E^{15}/cm^3$ to about $1E^{22}/cm^3$. When the semiconductor layer 100 is a P-type semiconductor layer, a doping concentration of the first region 140 may be in a range about $1E^{15}/cm^3$ to about $1E^{22}/cm^3$.

The first connect stack CS1 is provided on the first region 140. The first connect stack CS1 may include a conductive metal oxide layer 110 and a graphene layer 120 sequentially stacked. The conductive metal oxide layer 110 is present on the first region 140 and may be in contact with the first region 140. In one example, the conductive metal oxide layer 110 may directly contact the first region 140. In one example, the conductive metal oxide layer 110 may cover an entire surface of the first region 140.

In one example, the conductive metal oxide layer 110 may also cover a part of an upper surface of the semiconductor layer 100 around the first region 140. The conductive metal oxide layer 110 may be a material having a small energy band gap or a material having high conductivity by doping. In one example, the conductive metal oxide layer 110 may be a two-component, three-component, or four-component conductive metal oxide layer. When the conductive metal oxide layer 110 includes a two-component conductive metal oxide layer, for example, the conductive metal oxide layer 110 may include a $RuO_2$ layer, a $ReO_3$ layer, a CdO layer, an $IrO_2$ layer, a $CrO_2$ layer, an $In_2O_3$ layer, or a $SnO_2$ layer. When the conductive metal oxide layer 110 includes a three-component conductive metal oxide layer, for example, the conductive metal oxide layer 110 may include an indium-doped $SnO_2$ layer (ITO layer), an indium-doped ZnO layer (IZO layer), an aluminum doped ZnO layer (AZO layer) or a $SrRuO_3$ layer. When the conductive metal oxide layer 110 includes a four-component conductive metal oxide layer, for example, the conductive metal oxide layer 110 may include a $La_{0.5}Sr_{0.5}CoO_3$ layer.

In one example, the thickness of the conductive metal oxide layer 110 may be in a range of about 0.1 nm to about 2 nm. Also, a sheet resistance of the conductive metal oxide layer 110 may be greater than 0 and less than 1 MΩ/sq. The graphene layer 120 may be directly on the conductive metal oxide layer 110. In one example, the graphene layer 120 may cover an entire upper surface of the conductive metal oxide layer 110. The graphene layer 120 may be one of two-dimensional material layers. In one example, the graphene layer 120 may be a nano-crystalline graphene (nc-G) layer or a graphene sheet. In one example, the graphene layer 120 may include an nc-G layer or a graphene sheet. In another example, the graphene layer 120 may be a CNT layer or may include a CNT layer. In one example, the graphene layer 120 may be a single layer, but in another example, may be a multilayer. In any case, the thickness of the graphene layer 120 may be 3 nm or less. In one example, instead of the graphene layer 120, another two-dimensional material layer equivalent to at least graphene in conductivity may be used.

The metal layer 130 may be present on an uppermost layer of the first connect stack CS1. The metal layer 130 is provided on the graphene layer 120. The metal layer 130 may cover an entire upper surface of the graphene layer 120. In one example, the metal layer 130 may be a metal wiring. The metal layer 130 may be a metal layer including one selected from the group consisting of Cu, Ru, Rh, Ir, Mo, W, Pd, Pt, Co, Ti, Ni, Pd, Ta, Si, TiN, and TaN, or may be an alloy layer including at least one selected from the group. The metal layer 130 may be a single layer or multiple layers.

Figure 2:
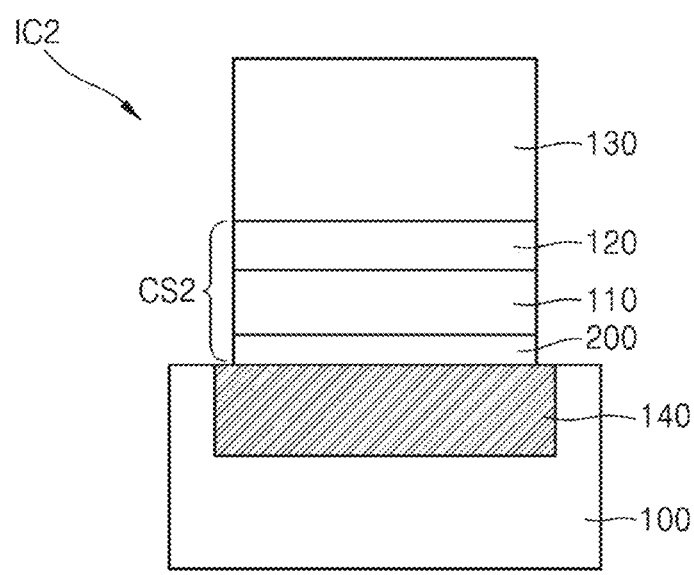
FIG. 2 is a cross-sectional view of a second interconnect structure according to an example embodiment.

FIG. 2 shows a second interconnect structure IC2 according to an example embodiment. Only parts different from the first interconnect structure IC1 of FIG. 1 will be described.

Referring to FIG. 2, the second interconnect structure IC2 includes a second connect stack CS2 between the semiconductor layer 100 and the metal layer 130. The second connect stack CS2 is a stacked structure including a metal silicide layer 200 between the first region 140 which is a highly doped layer of the semiconductor layer 100 and the conductive metal oxide layer 110.

In one example, a metal component included in the metal silicide layer 200 may be the same as the metal component included in the conductive metal oxide layer 110. In one example, the metal silicide layer 200 may have a uniform thickness like the conductive metal oxide layer 110 or the graphene layer 120. The metal silicide layer 200 may be parallel to the conductive metal oxide layer 110 or the graphene layer 120. The metal silicide layer 200 may directly contact the first region 140. For example, an entire bottom surface of the metal silicide layer 200 may be in contact with the first region 140. The conductive metal oxide layer 110 may directly contact the metal silicide layer 200. For example, an entire lower surface of the conductive metal oxide layer 110 may cover an entire upper surface of the metal silicide layer 200. Therefore, the conductive metal oxide layer 110 does not directly contact the first region 140. The metal silicide layer 200 may have a thickness, for example, in a range of about 0.1 nm to about 2 nm.

Components of the metal silicide layer 200 may be supplied from the conductive metal oxide layer 110 and the first region 140. Accordingly, the thickness of the metal silicide layer 200 may be affected by the conductive metal oxide layer 110 and the first region 140 during a manufacturing process. In consideration of the formation of the metal silicide layer 200, the conductive metal oxide layer 110 may include relatively more metal than when the metal silicide layer 200 is not provided. Accordingly, the conductive metal oxide layer 110 of the second interconnect structure IC2 may be a metal rich conductive metal oxide layer.

Figure 3:
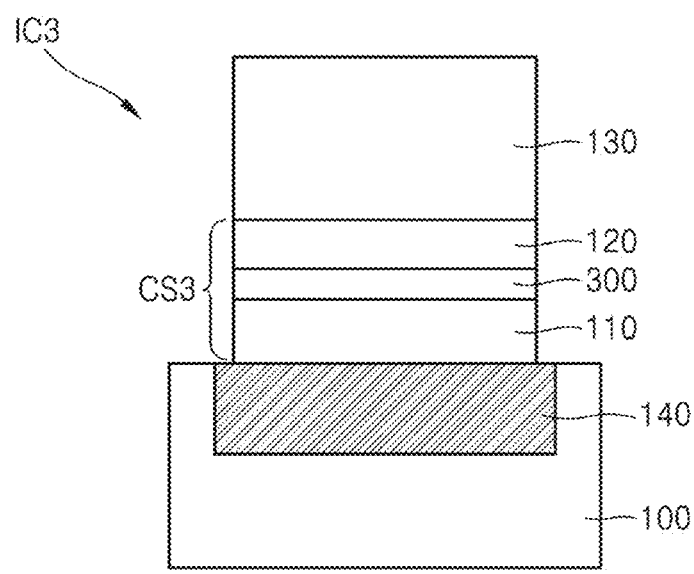
FIG. 3 is a cross-sectional view of a third interconnect structure according to an example embodiment.

FIG. 3 shows a third interconnect structure IC3 according to an example embodiment. Only parts different from the first interconnect structure IC1 of FIG. 1 will be described.

Referring to FIG. 3, the third interconnect structure IC3 includes a third connect stack CS3 between the semiconductor layer 100 and the metal layer 130. The third connect stack CS3 includes the conductive metal oxide layer 110, a metal carbide layer 300, and the graphene layer 120 sequentially stacked. That is, the third connect stack CS3 is a stack structure in which the metal carbide layer 300 is disposed between the conductive metal oxide layer 110 and the graphene layer 120 of the first connect stack CS1 of FIG. 1. The metal carbide layer 300 may directly contact the conductive metal oxide layer 110 and the graphene layer 120.

In one example, an entire lower surface of the metal carbide layer 300 is in direct contact with the upper surface of the conductive metal oxide layer 110. An entire upper surface of the metal carbide layer 300 may directly contact the lower surface of the graphene layer 120. Interfaces between the metal carbide layer 300, the graphene layer 120, and the conductive metal oxide layer 110 may be parallel to each other. The metal carbide layer 300 may have a thickness, for example, in a range from about 0.1 nm to about 2 nm.

In one example, the metal carbide layer 300 may be formed by combining a carbon component of the graphene layer 120 and a metal component of the conductive metal oxide layer 110. Therefore, the thickness of the metal carbide layer 300 may be affected by the conductive metal oxide layer 110 and the graphene layer 120. In this case, the conductive metal oxide layer 110 may be a metal-rich conductive metal oxide layer, and the graphene layer 120 may be a carbon-rich graphene layer.

Figure 4:
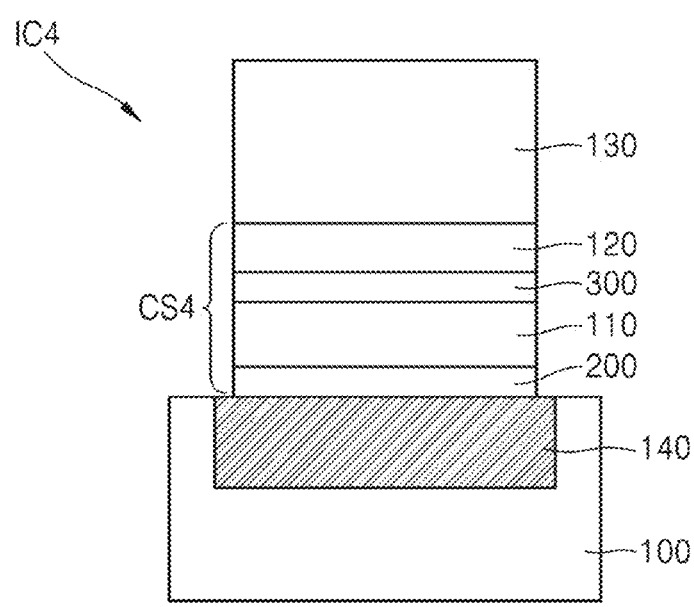
FIG. 4 is a cross-sectional view of a fourth interconnect structure according to an example embodiment.

FIG. 4 shows a fourth interconnect structure IC4 according to an example embodiment. Only parts different from the first interconnect structure IC1 of FIG. 1 will be described.

Referring to FIG. 4, the fourth interconnect structure IC4 includes a fourth connect stack CS4 between the semiconductor layer 100 and the metal layer 130. The uppermost layer, that is, the graphene layer 120 of the fourth connect stack CS4 is in contact with the metal layer 130, and the lowermost layer, that is, the metal silicide layer 200 thereof is in contact with the first region 140. The fourth connect stack CS4 includes the metal silicide layer 200, the conductive metal oxide layer 110, the metal carbide layer 300, and the graphene layer 120 sequentially stacked. The fourth connect stack CS4 is a stack structure in which the metal silicide layer 200 is arranged between the first region 140 and the first connect stack CS1 of FIG. 1, and the metal carbide layer 300 is arranged between the conductive metal oxide layer 110 and the graphene layer 120 of the first connect stack CS1. The fourth connect stack CS4 may be considered as a combination of the second connect stack CS2 of FIG. 2 and the third connect stack CS3 of FIG. 3. Widths of the layers 200, 110, 300, and 120 included in the fourth connect stack CS4 in a direction parallel to the semiconductor layer 100 may be the same. In one example, the graphene layer 120 of FIGS. 1 to 4 may be replaced with a semi-metal layer. In one example, the semi-metal layer may include at least one of a topological semi-metal (Weyl semimetal) and a Dirac semi-metal. In one example, the topological semi-metal may include at least one of MoP, NbP, NbAs, TaS, TaP, and TaAs. In one example, the Dirac semi-metal may include at least one of graphene, Na3Bi, and Cd3As2.

Figure 5:
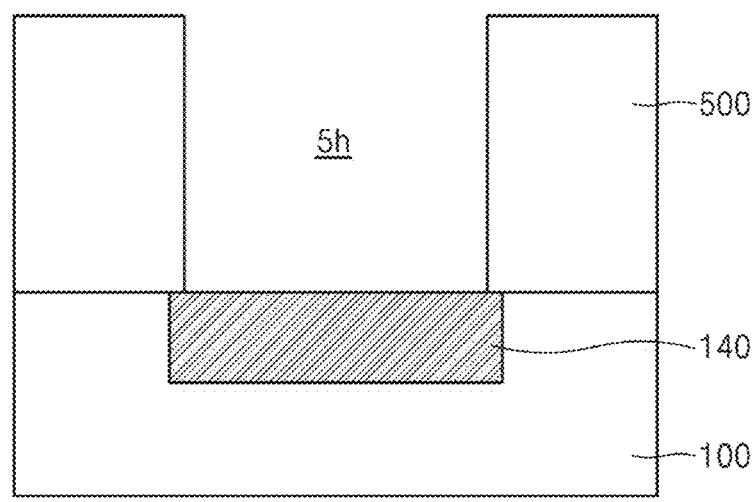
FIGS. 5 to 7 are cross-sectional views illustrating a case in which an interconnect structure according to an example embodiment is buried (surrounded) in an insulating layer.
Figure 6:
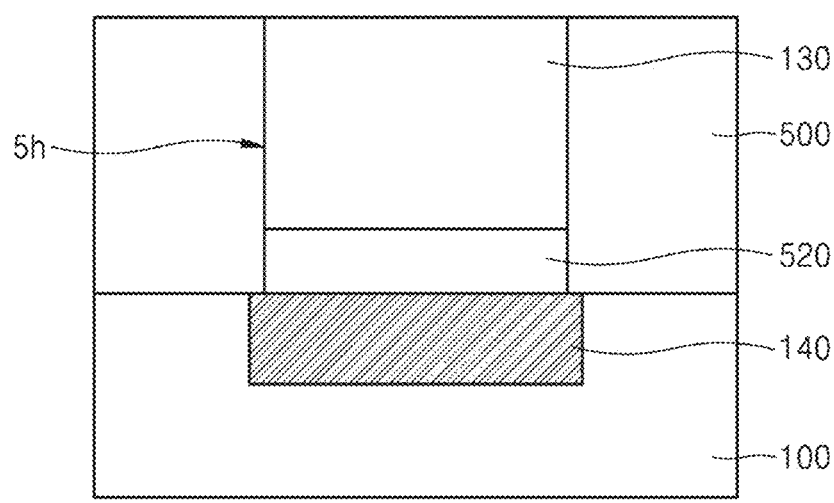

In one embodiment, the interconnect structure may be partially or entirely embedded in a given material layer. FIGS. 5 and 6 show an example of the interconnect structure.

Specifically, as shown in FIG. 5, an insulating layer 500 is present on the semiconductor layer 100, and the insulating layer 500 may include a via hole 5h through which the first region 140 is exposed. The insulating layer 500 may be an interlayer insulating layer. The insulating layer 500 may be a single layer or a multiple layer. At least a part of the first region 140 may be exposed through the via hole 5h.

Figure 7:
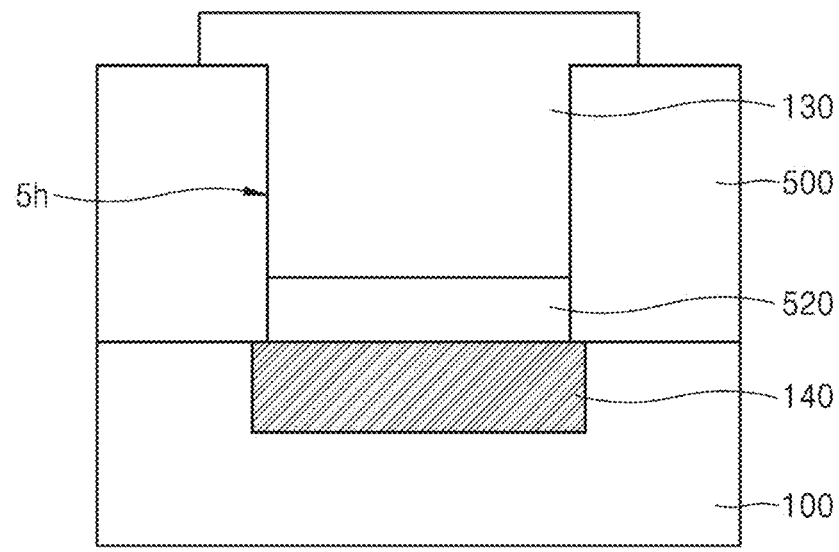

As shown in FIG. 6, the via hole 5h is filled with a connect layer 520 and the metal layer 130 sequentially stacked. The connect layer 520 may directly contact the entire first region 140 exposed through the via hole 5h. The connect layer 520 may be one or may include one of the first to fourth connect stacks CS1, CS2, CS3, and CS4. A height of an upper surface of the metal layer 130 may be the same as the height of an upper surface of the insulating layer 500 around the metal layer 130. In another example, as shown in FIG. 7, the metal layer 130 may extend over a partial region of the insulating layer 500. In FIG. 7, an upper surface of the metal layer 130 may be flat. FIGS. 6 and/or 7, the metal layer 130 may be used as an electrode layer.

Next, an electronic device including the interconnect structure described above will be described. A semiconductor device may also be included in the range of the electronic device.

Figure 8:
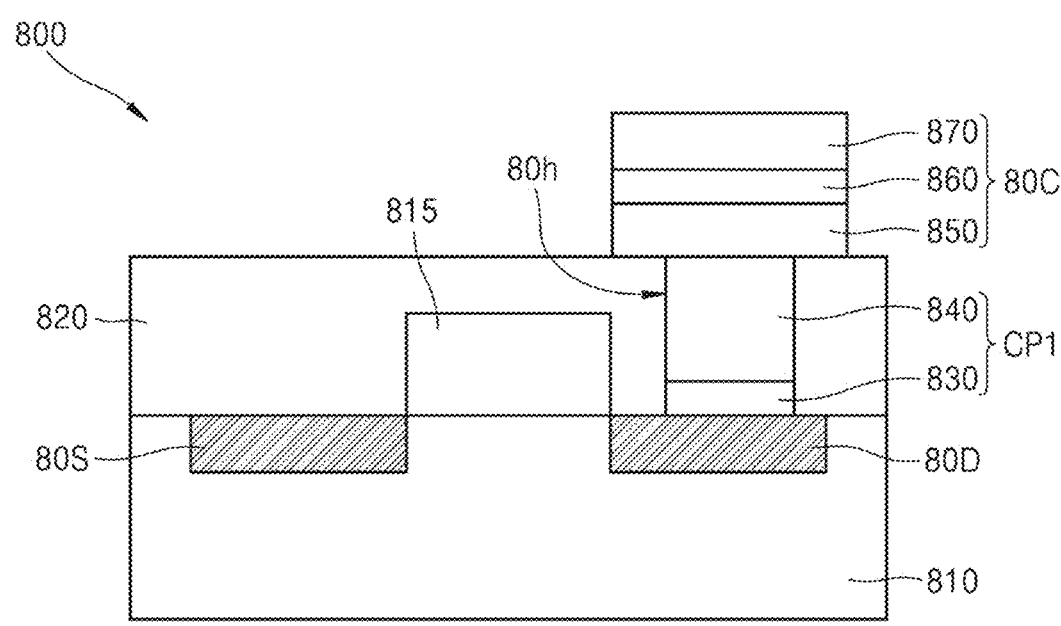
FIG. 8 shows a first electronic device according to an example embodiment.

FIG. 8 shows a first electronic device 800 according to an example embodiment. The first electronic device 800 may be a memory device (e.g., a DRAM) in which a field effect transistor and a data storage element 80C are combined.

Referring to FIG. 8, the first electronic device 800 includes a substrate 810, first and second doped regions 80S and 80D to the substrate 810, a gate stack 815 on the substrate 810, an interlayer insulating layer 820 covering the gate stack 815, and a data storage element 80C connected to the second doped region 80D through the conductive plug CP1. The substrate 810 may include a semiconductor layer. The material, type of doping, and degree of doping of the substrate 810 may be the same as those of the semiconductor layer 100 of FIGS. 1 to 7. The first and second doped regions 80S and 80D are separated from each other. A doping concentration of the first and second doped regions 80S and 80D may be within a doping concentration range of the first region 140 of FIGS. 1 to 7. The first doped region 80S may be a source region. The second doped region 80D may be a drain region. The gate stack 815 is provided on the substrate 810 between the first and second doped regions 80S and 80D. Both sides of a lower end of the gate stack 815 may contact the first and second doped regions 80S and 80D, respectively. The gate stack 815 may include a gate insulating layer and a gate layer sequentially stacked. The substrate 810, the doped regions 80S and 80D, and the gate stack 815 may function as a field effect transistor. The interlayer insulating layer 820 is formed on the substrate 810, covers the doped regions 80S and 80D as well as the gate stack 815, and includes a via hole 80h. The via hole 80h is arranged on the second doped region 80D. A part of the second doped region 80D is exposed through the via hole 80h. The via hole 80h is filled with a conductive plug CP1. The conductive plug CP1 includes a connect layer 830 and a metal layer 840 sequentially stacked. The connect layer 830 may cover an entire area exposed through the via hole 80h of the second doped region 80D. The connect layer 830 directly contacts the entire second doped region 80D exposed through the via hole 80h. The configuration and material of the connect layer 830 may be the same as the connect layer 520 of FIG. 6. An upper surface of the metal layer 840 may be the same level as the upper surface of the interlayer insulating layer 820. That is, the metal layer 840 completely fills up to an entrance of the via hole 80h. The configuration and material of the metal layer 840 may be the same as the metal layer 130 of FIGS. 1 to 7. The data storage element 80C may completely cover the via hole 80h and the conductive plug CP1. The data storage element 80C may also cover a partial area of the interlayer insulating layer 820 around the via hole 80h. The data storage element 80C may include a lower electrode 850, a dielectric layer 860, and an upper electrode 870 sequentially stacked. The lower electrode 850 may directly contact the metal layer 840 of the conductive plug CP1. The dielectric layer 860 may be a volatile or nonvolatile dielectric layer or may include such a dielectric layer. In one example, the dielectric layer 860 may include a ferroelectric layer. The data storage element 80C may be a capacitor.

Figure 9:
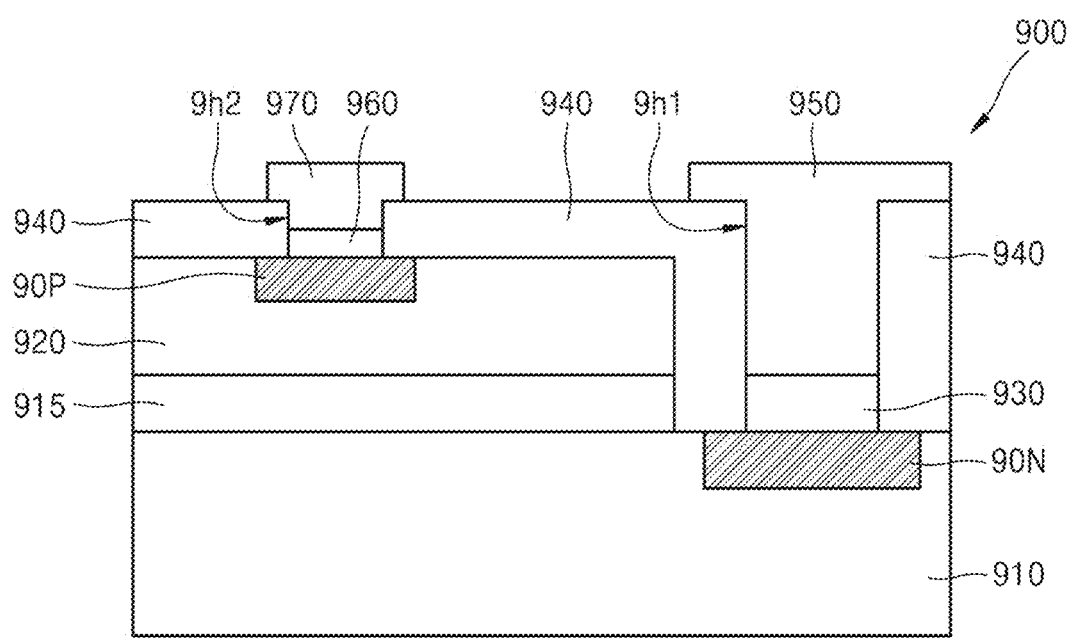
FIG. 9 shows a second electronic device according to an example embodiment.

FIG. 9 shows a second electronic device 900 according to an example embodiment. The second electronic device 900 may be an optical device.

Referring to FIG. 9, the second electronic device 900 may include a first semiconductor layer 910, an active layer 915, and a second semiconductor layer 920 sequentially stacked. The active layer 915 and the second semiconductor layer 920 are provided on a partial region of an upper surface of the first semiconductor layer 910. A first doped region 90N exists in the first semiconductor layer 910 around the active layer 915. The material, the type of doping, and the degree of doping of the first semiconductor layer 910 may be the same as the semiconductor layer 100 of FIG. 1. In one example, the first semiconductor layer 910 may include an N-type compound semiconductor layer. A doping concentration of the first doped region 90N may be within a doping concentration range of the first region 140 when the semiconductor layer 100 of FIG. 1 is an N-type semiconductor layer. The second semiconductor layer 920 may be a semiconductor layer of a type opposite to the first semiconductor layer 910. That is, the second semiconductor layer 920 may be the same as the first semiconductor layer 910 except that the dopant type is opposite to each other. In one example, the second semiconductor layer 920 may include a P-type compound semiconductor layer. The material, type of doping, and degree of doping of the second semiconductor layer 920 may be the same as when the semiconductor layer 100 of FIG. 1 is a P-type semiconductor layer. The second semiconductor layer 920 includes a second doped region 90P. A doping concentration of the second doped region 90P may be within a range of the doping concentration of the first region 140 when the semiconductor layer 100 of FIG. 1 is a P-type semiconductor layer. The active layer 915 is a multi-quantum well layer and may be a light emitting layer.

Upper surfaces of the first and second semiconductor layers 910 and 920 are covered with an interlayer insulating layer 940. Side surfaces of the active layer 915 and the second semiconductor layer 920 adjacent to the first doped region 90N are also covered with the interlayer insulating layer 940.

The interlayer insulating layer 940 includes first and second via holes 9h1 and 9h2 separated from each other. The first via hole 9h1 is separated from the active layer 915 and the second semiconductor layer 920. A part of the first doped region 90N is exposed through the first via hole 9h1. The second doped region 90P is exposed through the second via hole 9h2. The first via hole 9h1 is filled with a first connect layer 930 and a first metal layer 950 sequentially stacked. The first metal layer 950 may extend onto a partial area of an upper surface of the interlayer insulating layer 940. The second via hole 9h2 is filled with a second connect layer 960 and a second metal layer 970 sequentially stacked. The second metal layer 970 may extend onto a partial area of an upper surface of the interlayer insulating layer 940. Materials and configurations of each of the first and second connect layers 930 and 960 may be the same as those of the connect layer 520 of FIG. 6. Material and function of the first and second metal layers 950 and 970 may be the same as those of the metal layer 130 of FIG. 6.

Next, methods of manufacturing an interconnect structure according to an example embodiment will be described in detail with reference to FIGS. 10 to 16.

Figure 10:
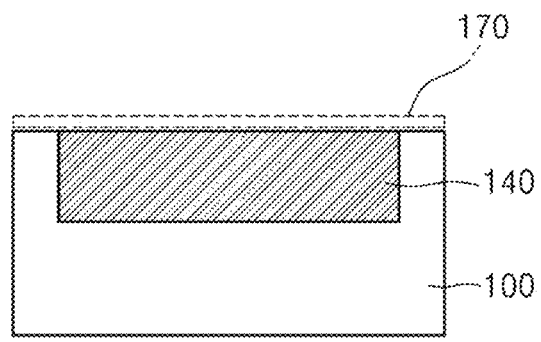
FIGS. 10 to 13 are cross-sectional views showing a method of manufacturing an interconnect structure according to an example embodiment.

Referring to FIG. 10, a first region 140 doped with a given doping concentration is formed in the semiconductor layer 100. The first region 140 may be formed such that, after forming the semiconductor layer 100 and defining a partial region of the semiconductor layer 100, the defined region is doped to a doping concentration higher than a doping concentration of the semiconductor layer 100. A dopant used for doping the semiconductor layer 100 and the first region 140 may be an N-type or a P-type. The first region 140 may be a region extending from the upper surface of the semiconductor layer 100 to a given depth downward. The first region 140 may be separated from a bottom surface of the semiconductor layer 100. In the drawing, it is depicted that the depth is uniform throughout the first region 140, but the depth may be different depending on the position within the first region 140. Reference numeral 170 denotes an oxide layer (e.g., SiO2) that may be naturally formed after the first region 140 is formed. Before proceeding with the subsequent process, the natural oxide layer 170 is removed.

Figure 11:
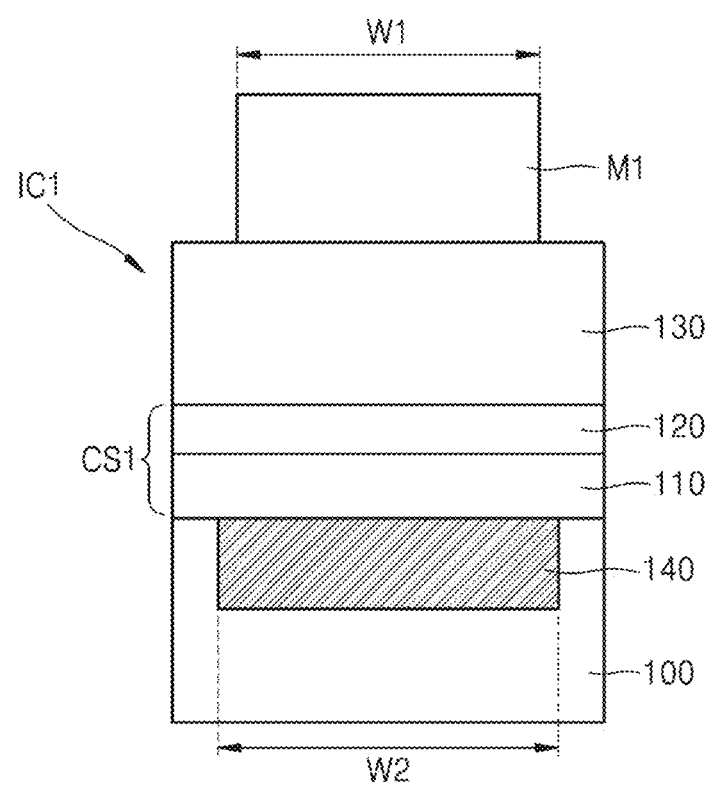

Next, as shown in FIG. 11, a first connect stack CS1 covering an entire first region 140 is formed on the semiconductor layer 100 from which the natural oxide layer 170 is removed. The first connect stack CS1 may be formed by sequentially stacking the conductive metal oxide layer 110 and the graphene layer 120. In one example, the conductive metal oxide layer 110 may be deposited by an atomic layer deposition (ALD) method. The graphene layer 120 may be formed directly on the conductive metal oxide layer 110 by using a direct growth method, or may be formed by transferring a graphene layer separately grown on the conductive metal oxide layer 110. A metal layer 130 is formed on the first connect stack CS1. The metal layer 130 may be formed by using a general metal layer depositing method. A first mask M1 is formed on a partial region of an upper surface of the metal layer 130. The first mask M1 may be a photoresist pattern. A region where a connect structure is to be formed may be defined in the first region 140 by the first mask M1. The first mask M1 may be vertically positioned on the first region 140, and a width W1 of the first mask M1 may be less than a width W2 of the first region 140.

Figure 12:
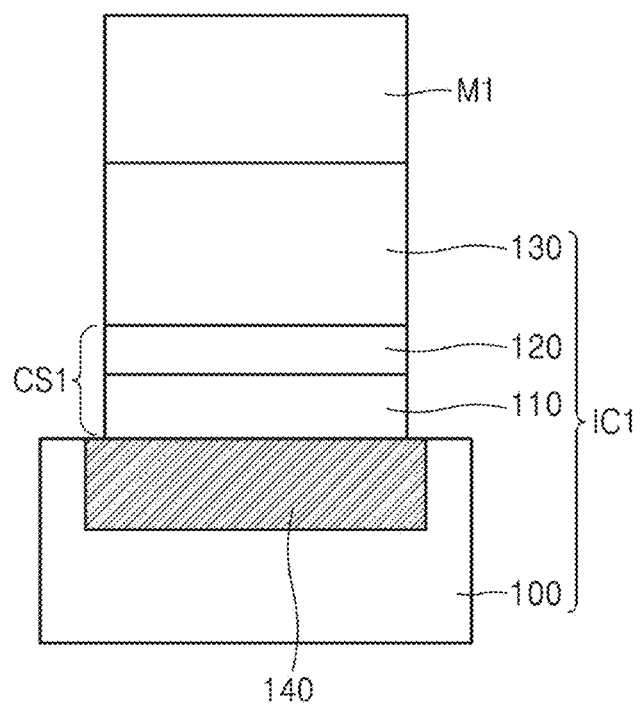
Figure 13:
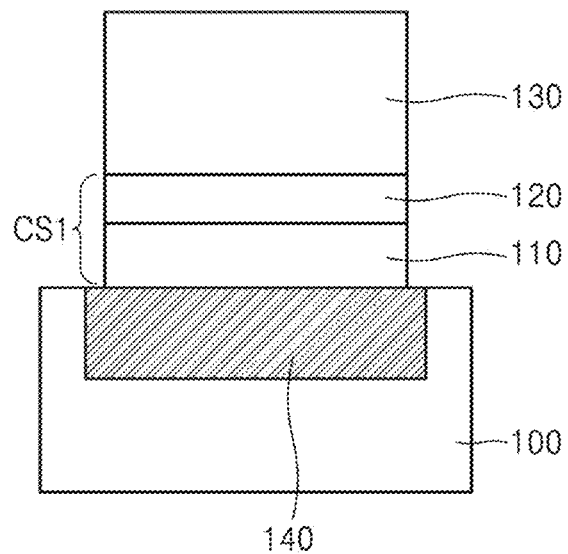

After the first mask M1 is formed, the metal layer 130, the graphene layer 120, and the conductive metal oxide layer 110 around the first mask M1 are sequentially etched. As a result, as shown in FIG. 12, the first interconnect structure IC1 including the first region 140 and the connect stack CS1 and the metal layer 130 that are sequentially stacked on a region of the first region 140 may be formed. Thereafter, the first mask M1 is removed by ashing. FIG. 13 shows a resultant product after removing the first mask M1.

Figure 14:
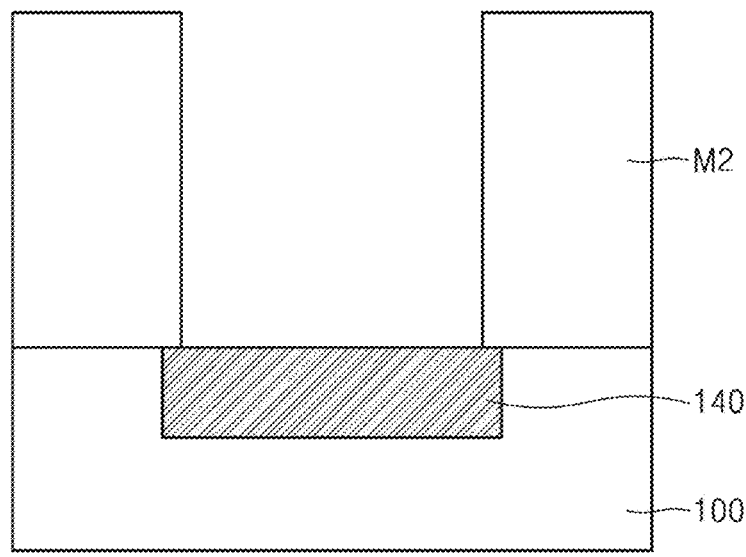
FIGS. 14 to 16 are cross-sectional views each showing an operation of a method of manufacturing an interconnect structure according to an example embodiment.
Figure 15:
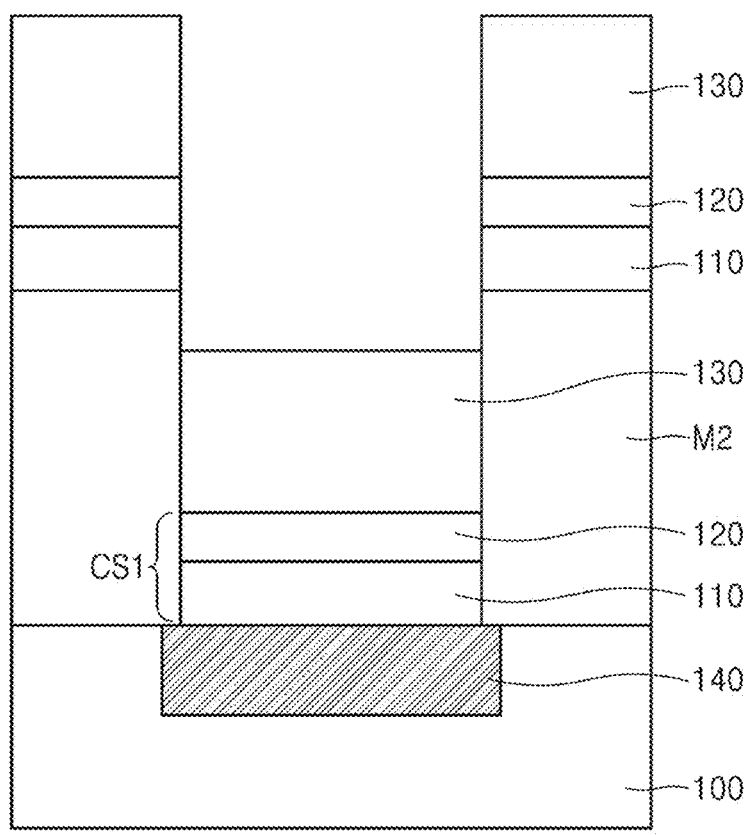
Figure 16:
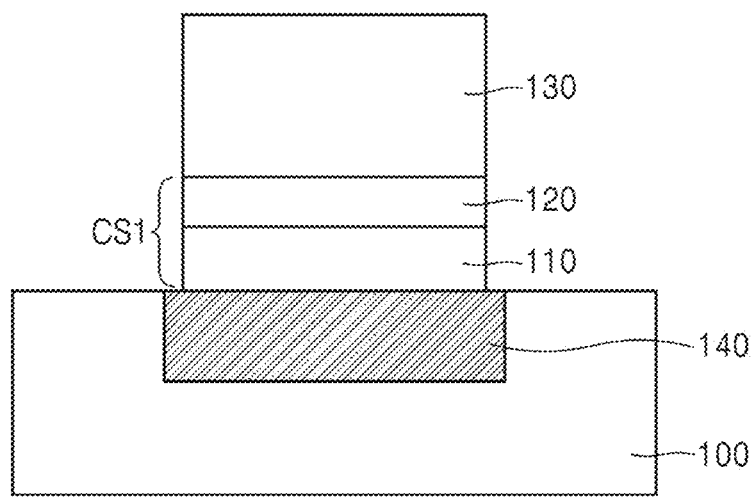

FIGS. 14 to 16 show each operation of a method of manufacturing an interconnect structure according to an example embodiment.

Referring to FIG. 14, a second mask M2 is formed on the semiconductor layer 100. When a natural oxide layer is present on the semiconductor layer 100, the second mask M2 may be formed after the natural oxide layer is removed. A part of the first region 140 is defined by the second mask M2, and only the defined region is exposed. The second mask M2 may be a photoresist pattern.

Next, as shown in FIG. 15, the first connect stack CS1 and the metal layer 130 are sequentially stacked on the exposed area of the first region 140. In this process, the conductive metal oxide layer 110, the graphene layer 120, and the metal layer 130 are sequentially stacked on an upper surface of the second mask M2. In the stacking process, a metal silicide layer may be further formed between the conductive metal oxide layer 110 and the first region 140, and a metal carbide layer may be further formed between the graphene layer 120 and the conductive metal oxide layer 110, and both the metal silicide layer and the metal carbide layer may be formed. This example may also be applied to the interconnect structure of FIG. 11.

Next, the second mask M2 is removed. In this process, the conductive metal oxide layer 110, the graphene layer 120, and the metal layer 130 stacked on an upper surface of the second mask M2 are also removed. As a result, as shown in FIG. 16, only the first connect stack CS1 and the metal layer 130 sequentially stacked may remain on the first region 140.

Figure 17:
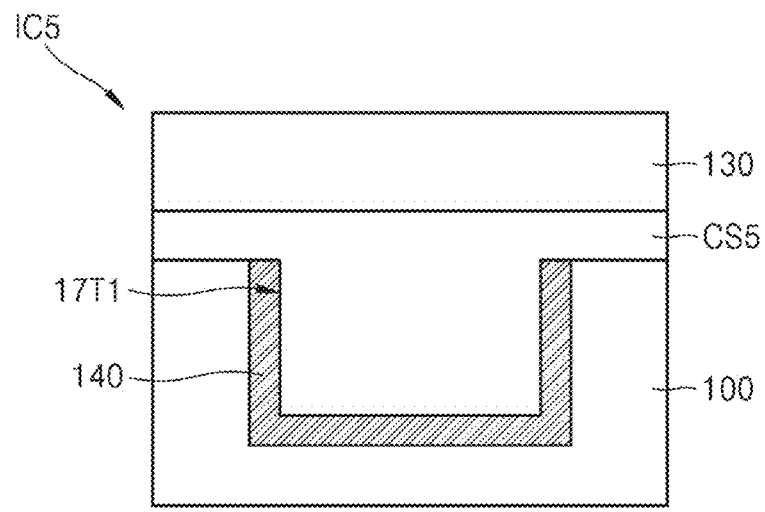
FIG. 17 is a cross-sectional view of a fifth interconnect structure according to an example embodiment.

FIG. 17 shows a fifth interconnect structure IC5 according to an example embodiment.

The fifth interconnect structure IC5 may correspond to an embodiment in which the substrate 100 of the first to fourth interconnect structures IC1, IC2, IC3, and IC4 includes a trench 17T1. Referring to FIG. 17, the first region 140 may be formed to the side layer and the bottom layer of the trench 17T1. The first region 140 provided to the side layer of the trench 17T1 is connected to the first region 140 provided to the bottom layer of the trench 17T1. In some embodiments, the entire side and bottom surfaces of the trench 17T1 may be the first region 140. A fifth connect stack CS5 configured to fill the trench 17T1 may be provided on the upper surface of the substrate 100. In some embodiments, the fifth connect stack CS5 may be one of the first to fourth connect stacks CS1, CS2, CS3, and CS4. The metal layer 130 may be provided on the fifth connect stack CS5.

Figure 18:
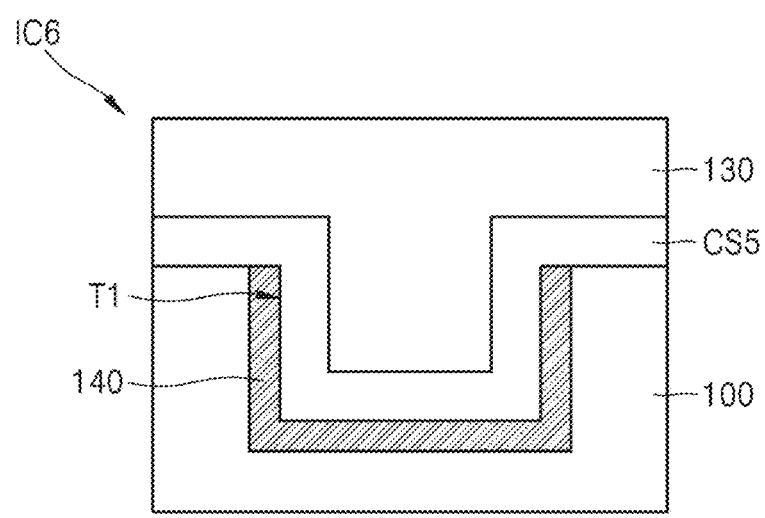
FIG. 18 is a cross-sectional view of a sixth interconnect structure according to an example embodiment.

A sixth interconnect structure IC6 shown in FIG. 18 may correspond to an embodiment in which the fifth connect stack CS5 of FIG. 17 is provided alone an inside surface of the trench 17T1. Referring to FIG. 18, the fifth connect stack CS5 may be configured to cover the entire inside surface of the trench 17T1. The trench 17T1 may partially be filled with the fifth connect stack CS5. The metal layer 130 may be provided on the fifth connect stack CS5 and configured to completely fill the rest of the trench 17T1.

Figure 19:
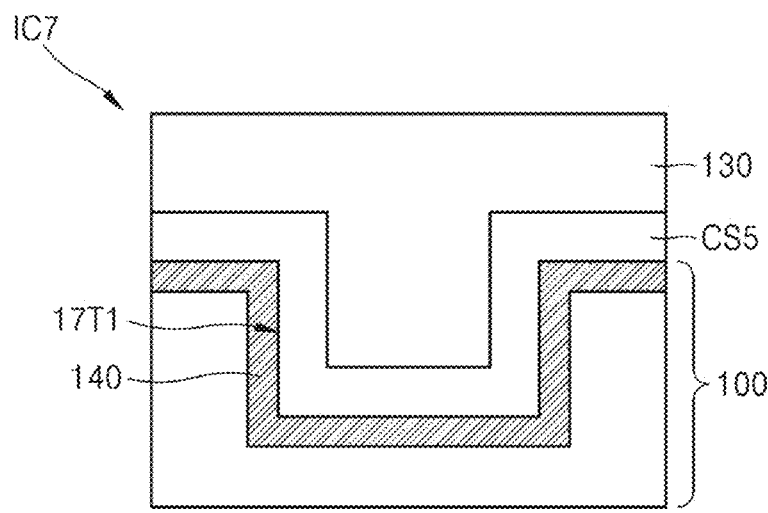
FIG. 19 is a cross-sectional view of a seventh interconnect structure according to an example embodiment.

FIG. 19 shows a seventh interconnect structure IC7 according to an example embodiment.

Referring to FIG. 19, the seventh interconnect structure IC7 may be an embodiment in which, in the sixth interconnect structure IC6, the upper layer of the substrate 100 around the trench 17T1 also includes the first region 140. The first region 140 of the upper layer of the substrate 100 is connected to the first region 140 of the trench 17T1. This figure of the seventh interconnect structure IC7 may be applied to the fifth interconnect structure IC5 of FIG. 17.

Figure 20:
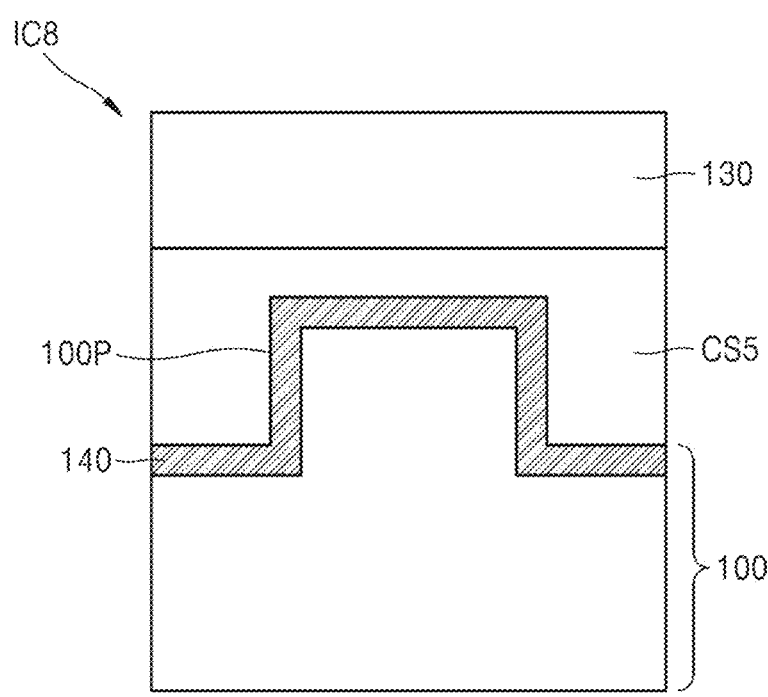
FIG. 20 is a cross-sectional view of an eighth interconnect structure according to an example embodiment.

FIG. 20 shows an eighth interconnect structure IC8 according to an example embodiment.

Referring to FIG. 20, in the eighth interconnect structure IC8, the substrate 100 may include a protruded portion 100P that is protruded in a direction perpendicular to the substrate 100. The upper layer and the side layer of the protruded portion 100P may include the first region 140 doped with a conductive impurity. The upper layer of the substrate 100 around the protruded portion 100P may also include the first region 140. The first region 140 of the upper layer of the substrate 100 is connected to the first region 140 of the upper layer and the side layer of the protruded portion 100P. The fifth connect stack CS5 may be configured to cover the entire protruded portion 100P. The metal layer 130 may be provided on the fifth connect stack CS5.

In an example embodiment, in the manufacturing method shown in FIGS. 10 to 16, the trench 17T1 or the protruded portion 100P may be formed to the substrate 100 and then the first region 140 may be formed in the trench 17T1 or the protruded portion 100P as shown in FIGS. 18 to 20.

In order to reduce a contact resistance between a graphene layer and a silicon layer in an interconnect structure of a metal layer/graphene layer/silicon layer, the disclosed interconnect structure includes a conductive metal oxide layer having a small band gap or capable of increasing conductivity by doping between the graphene layer and the silicon layer. In addition, a metal silicide layer may further be provided between the conductive metal oxide layer and the silicon layer, and a metal carbide layer may further be provided between the conductive metal oxide layer and the graphene layer. Accordingly, when the disclosed interconnect structure is used, the contact resistance of the existing metal layer/graphene layer/silicon layer interconnect structure may be reduced, thereby reducing power consumption and increasing an operation speed of electronic devices including semiconductor devices.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An interconnect structure comprising:
 a semiconductor layer including a first region having a doping concentration higher than a doping concentration of a rest region of the semiconductor layer;
 a metal layer facing the semiconductor layer;
 a semi-metal layer between the semiconductor layer and the metal layer; and
 a conductive metal oxide layer between the semi-metal layer and the semiconductor layer and covering the first region.

2. The interconnect structure of claim 1, further including an insulating layer on the semiconductor layer, the insulating layer including a via hole through which the first region is exposed, wherein
 the conductive metal oxide layer, the semi-metal layer, and the metal layer are sequentially stacked in the via hole.

3. The interconnect structure of claim 1, further comprising:
 a metal silicide layer between the semiconductor layer and the conductive metal oxide layer.

4. The interconnect structure of claim 1, further comprising:
 a metal carbide layer between the semi-metal layer and the conductive metal oxide layer.

5. The interconnect structure of claim 3, further comprising:
 a metal carbide layer between the semi-metal layer and the conductive metal oxide layer.

6. The interconnect structure of claim 1, wherein the conductive metal oxide layer includes a two-component conductive metal oxide layer, a three-component conductive metal oxide layer, or a four-component conductive metal oxide layer.

7. The interconnect structure of claim 1, wherein the semiconductor layer include a trench, and the first region is provided in a bottom layer and a side layer of the trench.

8. The interconnect structure of claim 1, wherein the semiconductor layer include a protruded portion, and the first region is provided in an upper layer and a side layer of the protruded portion.

9. An electronic device comprising:
 a transistor; and
 a data storage element connected to the transistor,
 wherein the transistor and the data storage element are connected to each other through the interconnect structure of claim 1.

10. The electronic device of claim 9, wherein the data storage element includes a ferroelectric capacitor including:
 a lower electrode in contact with the interconnect structure;
 a dielectric layer on the lower electrode; and
 an upper electrode on the dielectric layer.

11. The electronic device of claim 9, wherein the conductive metal oxide layer includes a two-component conductive metal oxide layer, a three-component conductive metal oxide layer, or a four-component conductive metal oxide layer.

12. An electronic device comprising:
 a first semiconductor layer having a first doped region;
 a multi-quantum well layer on the first semiconductor layer so as not to contact the first doped region;
 a second semiconductor layer on the multi-quantum well layer and having a second doped region;
 a first connect layer and a first metal layer sequentially stacked on the first doped region; and
 a second connect layer and a second metal layer sequentially stacked on the second doped region, wherein
 each of the first connect layer and the second connect layer includes a conductive metal oxide layer and a semi-metal layer on the conductive metal oxide layer.

13. The electronic device of claim 12, further comprising:
a metal silicide layer between the conductive metal oxide layer and the first doped region and the second doped region.

14. The electronic device of claim 12, further comprising:
a metal carbide layer between the semi-metal layer and the conductive metal oxide layer.

15. The electronic device of claim 12, wherein the conductive metal oxide layer includes a two-component conductive metal oxide layer, a three-component conductive metal oxide layer, or a four-component system conductive metal oxide layer.

16. A method of manufacturing an interconnect structure, the method comprising:
forming a first doped region in a semiconductor layer, the first doped region having a doping concentration greater than a doping concentration of a rest region of the semiconductor layer; and
sequentially stacking a conductive metal oxide layer, a semi-metal layer, and a metal layer covering the first doped region on the semiconductor layer.

17. The method of claim 16, further comprising:
forming a metal silicide layer between the conductive metal oxide layer and the semiconductor layer.

18. The method of claim 17, wherein the conductive metal oxide layer comprises a metal-rich conductive metal oxide layer.

19. The method of claim 16, further comprising:
forming a metal carbide layer between the conductive metal oxide layer and the semi-metal layer.

20. The method of claim 16, further comprising:
forming a mask exposing a portion of the first doped region on the semiconductor layer to provide an exposed area of the first doped region;
sequentially stacking the conductive metal oxide layer, the semi-metal layer, and the metal layer covering the exposed area of the first doped region; and
removing the mask.

* * * * *